United States Patent
Jeong et al.

(10) Patent No.: US 10,008,508 B2
(45) Date of Patent: Jun. 26, 2018

(54) ONE TIME PROGRAMMABLE (OTP) CELL HAVING IMPROVED PROGRAMMING RELIABILITY

(71) Applicant: Magnachip Semiconductor, Ltd., Cheongju-si (KR)

(72) Inventors: Duk Ju Jeong, Seoul (KR); Sung Bum Park, Seongnam-si (KR); Kee Sik Ahn, Hwaseong-si (KR); Young Chul Seo, Gwangmyeong-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days. days.

(21) Appl. No.: 15/495,278

(22) Filed: Apr. 24, 2017

(65) Prior Publication Data

US 2018/0047735 A1    Feb. 15, 2018

(30) Foreign Application Priority Data

Aug. 9, 2016    (KR) .................. 10-2016-0101305

(51) Int. Cl.
| | |
|---|---|
| *G11C 17/16* | (2006.01) |
| *H01L 27/112* | (2006.01) |
| *H01L 23/525* | (2006.01) |
| *H01L 29/16* | (2006.01) |
| *H01L 29/161* | (2006.01) |
| *H01L 29/20* | (2006.01) |
| *H01L 29/10* | (2006.01) |
| *H01L 29/06* | (2006.01) |
| *G11C 17/18* | (2006.01) |

(52) U.S. Cl.
CPC ........ *H01L 27/11206* (2013.01); *G11C 17/16* (2013.01); *G11C 17/18* (2013.01); *H01L 23/5252* (2013.01); *H01L 29/0649* (2013.01); *H01L 29/1083* (2013.01); *H01L 29/16* (2013.01); *H01L 29/161* (2013.01); *H01L 29/1608* (2013.01); *H01L 29/20* (2013.01)

(58) Field of Classification Search
CPC ................... G11C 5/14; G11C 17/16
USPC ..................................... 365/96, 226
See application file for complete search history.

(56) References Cited

U.S. PATENT DOCUMENTS

| | | | |
|---|---|---|---|
| 6,798,693 B2 | 9/2004 | Peng | |
| 2009/0262567 A1* | 10/2009 | Shin | G11O 5/147 365/96 |
| 2010/0110750 A1* | 5/2010 | Namekawa | G11O 5/145 365/96 |
| 2012/0163089 A1* | 6/2012 | Saeki | G11C 16/0466 365/185.18 |
| 2013/0076392 A1* | 3/2013 | Zaitsu | H03K 19/17728 326/41 |
| 2014/0369135 A1* | 12/2014 | Wang | G11C 16/10 365/185.26 |
| 2017/0018543 A1* | 1/2017 | Elsayed | G06F 17/5068 |
| 2017/0033116 A1* | 2/2017 | Wang | H01L 21/28273 |

* cited by examiner

*Primary Examiner* — Michael Tran
(74) *Attorney, Agent, or Firm* — NSIP Law

(57) ABSTRACT

A non-volatile semiconductor storage device includes a gate insulating film formed on a semiconductor substrate, a gate electrode formed on the gate insulating film, and first and second spaced apart doped regions formed below the gate insulating film and the gate electrode in the semiconductor substrate, wherein a grounded region of the first and second spaced apart doped regions is grounded via a contact.

18 Claims, 8 Drawing Sheets

FIG. 8

| Cell | State | Program | | Read | |
|---|---|---|---|---|---|
| | | WL | BL | WL | BL |
| Cell 0 | Programmed | VPP | VPP | VREAD | VREAD |
| Cell 1 | Unprogrammed | VPP | 0 | VREAD | 0 |
| Cell 2 | Unprogrammed | 0 | VPP | 0 | VREAD |
| Cell 3 | Unprogrammed | 0 | 0 | 0 | 0 | ions
ONE TIME PROGRAMMABLE (OTP) CELL HAVING IMPROVED PROGRAMMING RELIABILITY

CROSS-REFERENCE TO RELATED APPLICATIONS

This application claims the benefit under 35 USC 119(a) of Korean Patent Application No. 10-2016-0101305 filed on Aug. 9, 2016 in the Korean Intellectual Property Office, the entire disclosure of which is incorporated herein by reference for all purposes.

BACKGROUND

1. Field

The following description relates to one time programmable (OTP) cell. The following description also relates to an OTP cell with improved programming reliability.

2. Description of Related Art

As is known in the art, a non-volatile one time programmable (OTP) memory has the characteristic that information stored therein does not disappear, even under a power-off condition. For this reason, the OTP memory has firmly established its position as an essential element of a modern semiconductor integrated circuit device. Such an OTP memory has multiple cells, one of which constitutes a unit cell of the memory, referred to as an "OTP cell." An OTP cell may be used for various purposes other than forming a non-volatile memory. For example, a group of a few OTP cells may be utilized to tune or trim parameters of an analog circuit device or set operational parameters in devices such as a micro-controller and a micro-processor. Furthermore, the OTP cells may also be utilized for the purpose of permanently storing a relatively small number of data bits such as identification data of an integrated circuit chip, a code of an encryption key, and information for management.

An OTP cell may generally be realized as, for example, a charge storage type, a capacitor type, a fuse, or an anti-fuse. Among these examples, the anti-fuse is known to be initially in a non-conductive state, and then becomes conductive when it is programmed, as opposed to the fuse. To program the anti-fuse, a high dielectric field is applied to a dielectric material such as oxide to allow a tunneling current to flow through the dielectric material. The tunneling current flowing through the dielectric material causes a phenomenon called "dielectric breakdown." If dielectric breakdown occurs, a conductive path through the dielectric material is formed. Accordingly, the anti-fuse becomes conductive and is programmed.

Various embodiments of an anti-fuse type OTP cell are known. Most of these anti-fuse type OTP cells have a metal-oxide-semiconductor (MOS) transistor structure, including a gate insulating film and a gate electrode formed on a semiconductor substrate. In order to program the OTP cell of the MOS transistor structure, a program voltage is applied to the OTP cell to have the gate insulating film broken down. Thus, a resistive path is formed between the gate electrode and a bulk region of the semiconductor substrate. In this example, only when the gate insulating film is definitely broken down in a wide area, the formed resistive path is able to have a low blowing resistance to achieve clear programming. Therefore, extensive research has been performed in the art to dependably break down the gate insulating film by applying a relatively low program voltage and to accordingly achieve successful programming.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a non-volatile semiconductor storage device includes a gate insulating film formed on a semiconductor substrate, a gate electrode formed on the gate insulating film, and first and second spaced apart doped regions formed below the gate insulating film and the gate electrode in the semiconductor substrate, wherein a grounded region of the first and second spaced apart doped regions is grounded via a contact.

A semiconductor layer of the semiconductor substrate may be formed of Si, Ge, SiGe, GaP, GaAs, SiC, SiGeC, InAs, or InP.

The gate insulating film may be formed of an oxide film, a nitride film, an oxynitride film, a metal oxide film, or a laminated film of a combination of two or more of oxide, nitride, oxynitride, and metal oxide films.

The gate insulating film may have a thickness that is able to be broken down by a voltage of about DC 5 V.

The device may further include a well tap region formed adjacent to the first spaced apart doped region or the second spaced apart doped region in the semiconductor substrate, wherein the well tap region is grounded via a second contact.

A first well region may be formed in the semiconductor substrate, and the first and the second spaced apart doped regions and the well tap region may be formed within the first well region.

In response to a write voltage being applied to the gate electrode, the gate insulating film may be broken down so that a resistive path is formed between the gate electrode and the well region.

In response to the write voltage being applied to the gate electrode, the resistive path may be formed between the gate electrode and the grounded region.

The device may further include a second gate insulating film formed on the semiconductor substrate, a second gate electrode formed on the second gate insulating film, and third and fourth spaced apart doped regions formed below the second gate insulating film and the second gate electrode in the semiconductor substrate.

A second well region may be formed in the semiconductor substrate, and the third and fourth spaced apart doped regions may be formed within the second well region.

The device may further include a third contact formed on the gate electrode and a fourth contact formed on the fourth doped region, wherein the gate electrode and the fourth doped region are connected via the third contact and the fourth contact.

The gate insulating film, the gate electrode, and the first and second spaced apart doped regions may constitute a low voltage (LV) transistor, the second gate insulating film, the second gate electrode, and the third and fourth spaced apart doped regions may constitute a middle voltage (MV) transistor, and the LV transistor and the MV transistor may be separated by a shallow trench isolation (STI) structure in the semiconductor substrate.

The LV transistor may be an n-type Metal-Oxide-Semiconductor (MOS) transistor.

In another general aspect, a one time programmable (OTP) cell includes a first MOS transistor formed in a middle voltage (MV) transistor area in a semiconductor substrate, and a second MOS transistor formed in a low voltage (LV) transistor area in the semiconductor substrate, wherein the second MOS transistor includes a gate electrode and first and second doped regions formed in the LV transistor area, and the gate electrode is connected to the first MOS transistor via a contact, wherein either one or both of the first and second doped regions is grounded via a second contact.

The OTP cell may further include a well tap region formed adjacent to the first doped region or the second doped region in the LV transistor area, wherein the well tap region is grounded via a third contact.

The semiconductor substrate may include a LV well region formed in the LV transistor area, and the first and second doped regions and the well tap region are formed within the LV well region.

The second MOS transistor may further include a gate insulating film formed below the gate electrode in the LV transistor area, and in response to a write voltage being applied to the gate electrode via the first MOS transistor, the gate electrode may be broken down so that a resistive path is formed between the gate electrode and the well region.

In response to the write voltage being applied to the gate electrode via the first MOS transistor, a resistive path may be formed between one region of the first doped region, the second doped region, and the well region, and the gate electrode.

The MV transistor area and the LV transistor area may be separated by a shallow trench isolation (STI) structure in the semiconductor substrate.

The MV transistor area may include an MV well region formed in the semiconductor substrate.

Other features and aspects will be apparent from the following detailed description, the drawings, and the claims.

BRIEF DESCRIPTION OF THE DRAWINGS

FIG. 8 is a view illustrating a truth table for explaining program operation and read operation for each cell in the OTP cell array, according to an example.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
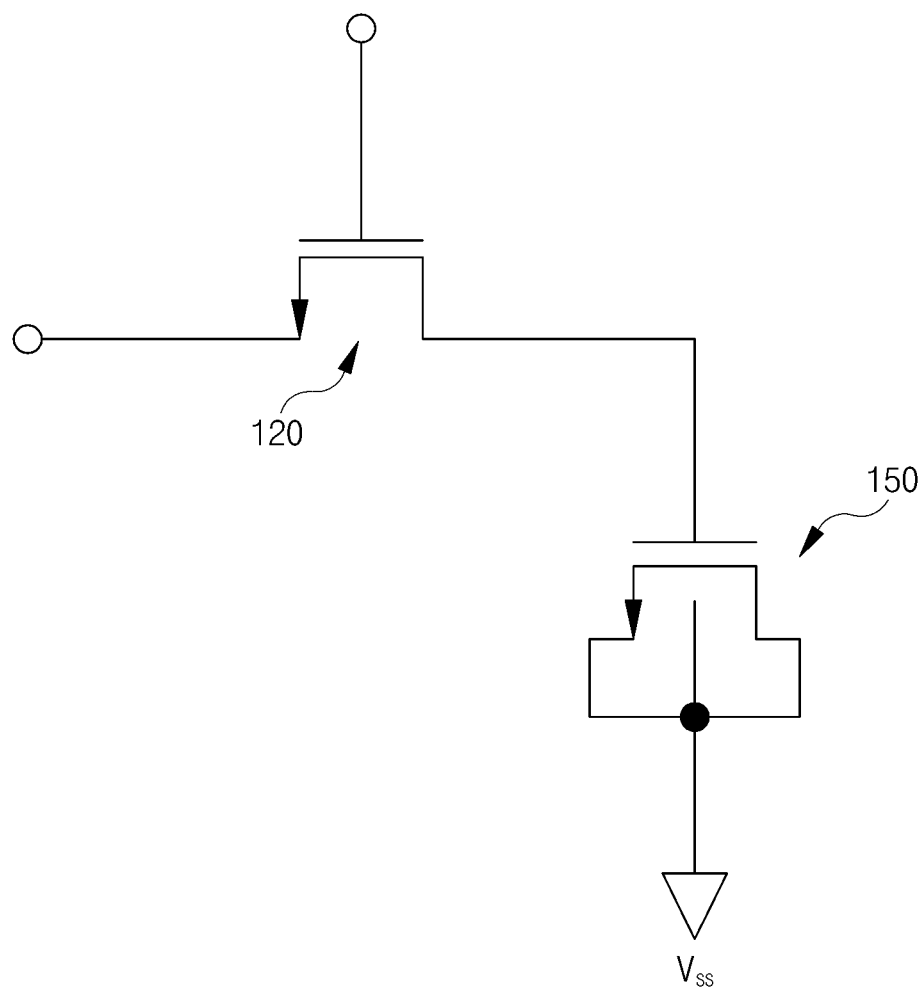
FIG. 1 is a view illustrating an equivalent circuit of a one-time programmable (OTP) cell, according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

In this disclosure, various examples and implementations are described in further detail to provide a one time programmable (OTP) cell having improved programming reliability. Examples are described in more detail below with reference to the appended drawings.

FIG. 1 is a view illustrating an equivalent circuit of a one-time programmable (OTP) cell, according to an example.

As illustrated in the example of FIG. 1, an OTP cell 100 includes a selection transistor 120 and an anti-fuse 150 connected to the selection transistor 120. For example, the selection transistor 120 is an n-type metal-oxide-semiconductor field-effect transistor (MOSFET) or a p-type MOSFET. When the selection transistor 120 is implemented as an n-type MOSFET as in the illustrated example of FIG. 1, a drain terminal of the selection transistor 120 is connected to a path to which a program voltage is applied, such as a bit line BL of a memory array circuit, and a source terminal of the selection transistor 120 is connected to the anti-fuse 150. For example, a gate terminal of the selection transistor 120 is connected to a line to which an enable signal is applied, like a word line WL of a memory array circuit. In such an example, the anti-fuse transistor 150 is implemented as an n-type MOSFET or a p-type MOSFET. The gate terminal of the anti-fuse transistor 150 is connected to the source terminal of the selection transistor 120, and a bulk region of the anti-fuse transistor 150 is connected to a ground voltage, such as a voltage Vss, and is accordingly grounded.

Figure 2:
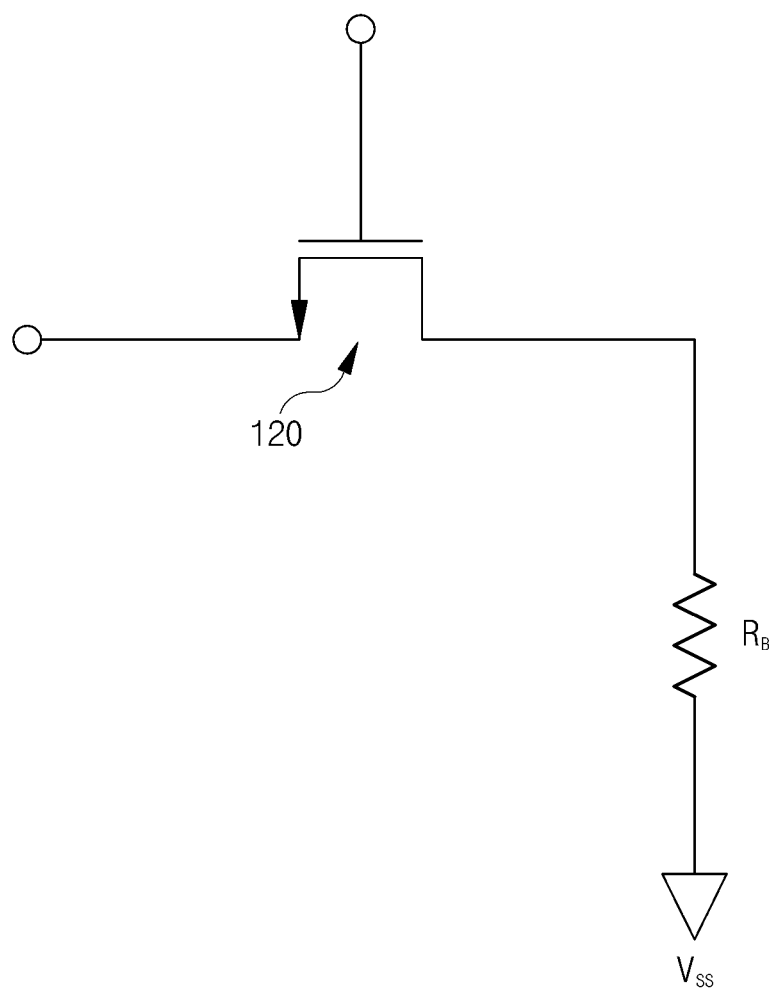
FIG. 2 is a view illustrating an equivalent circuit of a programmed OTP cell, according to an example.

When a program voltage VPP is applied to the drain terminal of the selection transistor 120 and the enable signal is applied to the gate terminal of the selection transistor 120, a path is formed between the drain and the source of the selection transistor 120. Also, a voltage, more specifically, a read voltage, is applied to a gate of the anti-fuse transistor 150, so that the gate insulating film of the anti-fuse transistor 150 breaks down and functions as a resistive path having a random resistance voltage value RB as shown in the example of FIG. 2. In this example, it is said that the anti-fuse transistor 150 is programmed, and a voltage value that is present at this time is referred to as a blowing resistance. In such an example, to facilitate breakdown of the gate insulating film of the anti-fuse transistor 150 even while applying a relatively low voltage, a thickness of the gate insulating film of the anti-fuse transistor 150 is formed to be smaller than that of the gate insulating film of the selection transistor 120. For this reason, the anti-fuse transistor 150 is implemented in a low voltage (LV) transistor area on a semiconductor substrate and the selection transistor 120 is implemented in a middle voltage (MV) transistor area. It is established that the gate insulating film of the MOS transistor implemented in the LV transistor region breaks down when a voltage of about DC 1.5 V is applied to the gate of the MOS transistor. Also, the gate insulating film of the MOS transistor implemented in the MV transistor region breaks down when a voltage of about DC 5 V is applied to the gate of the MOS transistor.

According to the present examples, at least one of a source side and a drain side of the anti-fuse transistor 150, besides the bulk region of the anti-fuse transistor 150, is connected to a ground voltage such as the voltage Vss and is accordingly grounded. When the source side or the drain side of the anti-fuse transistor 150 is grounded, a voltage is dropped across a path between the gate and the source or between the gate and the drain of the anti-fuse transistor 150, in addition to between the gate and the bulk region of the anti-fuse transistor 150 at a time of programming the OTP cell 100. Therefore, a resistive path is also formed between the gate and the source of the anti-fuse transistor 150 or the gate and the drain of the anti-fuse transistor 150. Because an additional resistive path is formed besides the resistive path between the gate and the bulk region of the anti-fuse transistor 150, the blowing resistance is accordingly decreased so that programming reliability of the OTP cell 100 is able to be enhanced. Even when hard breakdown fails to occur at the gate insulating film of the anti-fuse transistor 150 at a time of programming of the OTP cell 100, a programming success rate is able to be increased because a resistive path is additionally formed between the gate and the source of the anti-fuse transistor 150 or between the gate and the drain of the anti-fuse transistor 150. In an example, both the source side and the drain side of the anti-fuse transistor 150 are able to be grounded. In this example, programming is able to be performed even when any one of a source junction, a drain junction, and the gate insulating film of the anti-fuse transistor 150 breaks down at a time of programming of the OTP cell 100. Thus, programming reliability is able to be further enhanced.

Figure 3:
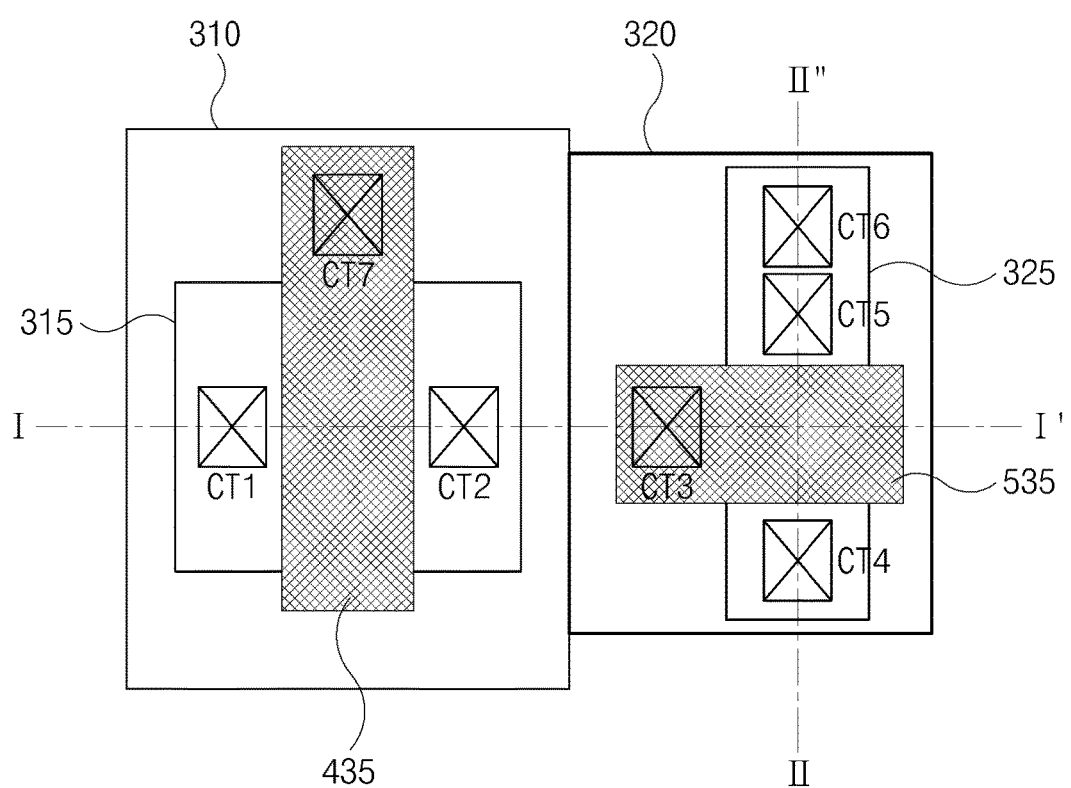
FIG. 3 is a view illustrating a layout diagram of the OTP cell of FIG. 1, according to an example.
Figure 4:
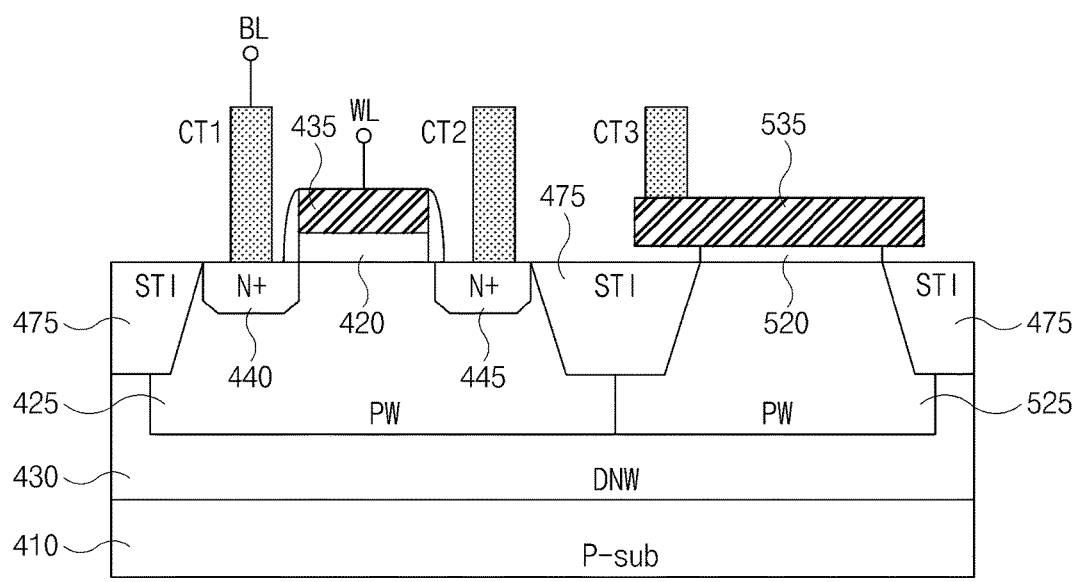
FIG. 4 is a cross-sectional view taken along line I-I' in the OTP cell of FIG. 3, according to an example.
Figure 5:
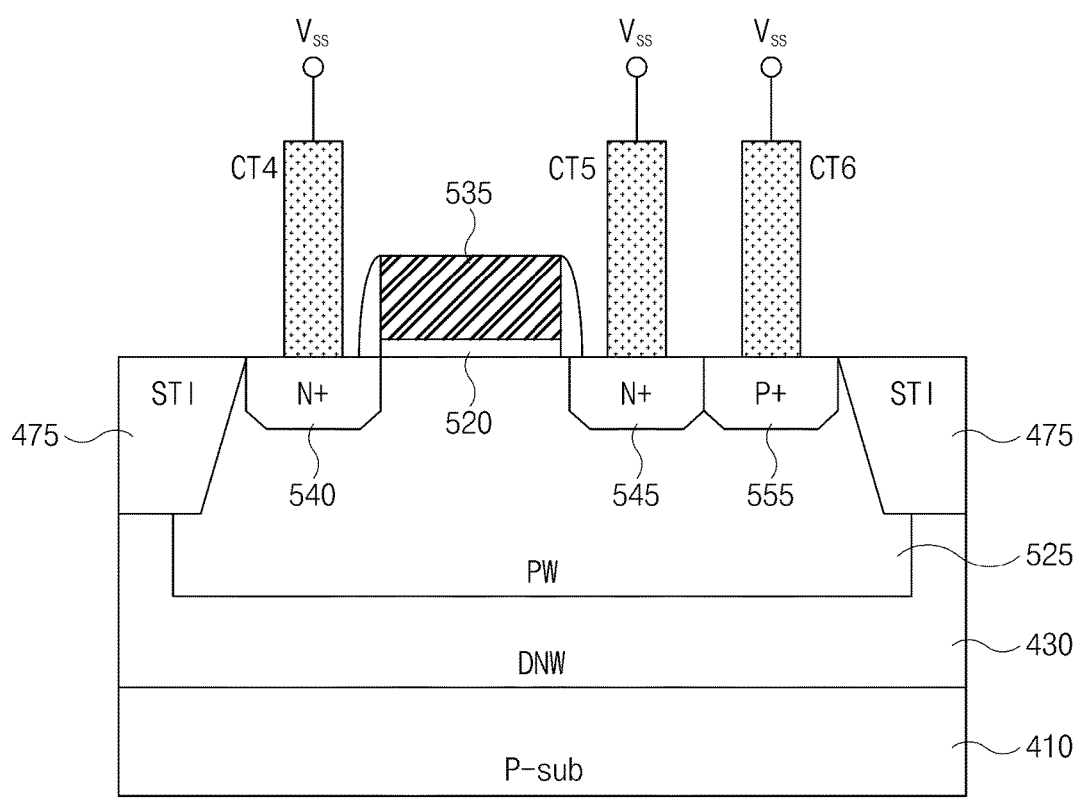
FIG. 5 is a cross-sectional view taken along line II-II' in the OTP cell of FIG. 3, according to an example.

FIG. 3 is a view illustrating a layout diagram of the OTP cell of FIG. 1, according to an example. FIG. 4 is a cross-sectional view taken along line I-I' in the OTP cell of FIG. 3, according to an example. FIG. 5 is a cross-sectional view taken along line II-II' in the OTP cell of FIG. 3, according to an example. Hereinafter, a configuration of the OTP cell according to the present examples are described in further detail with reference to the examples of FIG. 3 to FIG. 5.

As shown in the example of FIG. 3, the OTP cell 100 includes a MV transistor 310 that implements a selection transistor 120 and a LV transistor 320 that is arranged adjacent to the MV transistor 310 in order to implement the anti-fuse transistor 150. In such an example, the MV transistor 310 and the LV transistor 320 are separated from each other by a shallow trench isolation 475 formed in a region, except for an active region 315 and an active region 325 as shown in the example of FIG. 3, in the semiconductor substrate 410.

Referring to the example of FIG. 4, the MV transistor 310 includes a gate insulating film 420 formed on the semiconductor substrate 410. In such an example, the semiconductor substrate 410 may be a bulk substrate or a silicon on insulator (SOI) substrate. For example, a semiconductor layer of the semiconductor substrate 410 is formed of a semiconducting material such as Si, Ge, SiGe, GaP, GaAs, SiC, SiGeC, InAs or InP. However, these are only examples, and other semiconducting materials are used in the semiconductor substrate 410 in other examples. In the example of FIG. 4, the semiconductor substrate 410 includes a well 425, which is formed on the semiconductor substrate 410 via a deep n-well (DNW) 430 structure, as shown in FIG. 4. For example, the well 425 is formed by injecting ions of a particular conductivity type into the semiconductor substrate 410. In such an example, the well 425 is a p-well formed by injecting p-type ions as shown in the example of FIG. 4. The gate insulating film 420 is formed on the well 425 of the semiconductor substrate 410. For example, the gate insulating film 420 is formed by using an oxide film, a nitride film, an oxynitride film, a metal oxide film, or a laminated film of a combination of those films. However, these examples are not to be limiting, and other similar films are used in other examples. In an example, the gate insulating film 420 is formed to have a thickness that is able to be broken down by a voltage of about DC 5 V.

For example, the MV transistor 310 includes a gate electrode 435 laminated on the gate insulating film 420. As established in the art, the gate electrode 435 is potentially formed of a material such as polysilicon or metal. In such an example, the gate electrode 435 has a doping type that is opposite to that of the well 425 of the semiconductor substrate 410. Thus, if the well 425 of the semiconductor substrate 410 is a p-type well, the gate electrode 435 is doped by ions of an n-type. If the well 425 is an n-type well, the gate electrode 435 is doped by ions of a p-type. Additionally, the gate electrode 435 of the MV transistor 310 is connected to a word line WL of a memory array circuit.

In the example of FIG. 4, the MV transistor 310 further includes spaced apart doped regions 440, 445 below the gate electrode 435 and the gate insulating film 420 and at left and right sides of the gate electrode 435 in the active region 315. For example, the doped regions 440, 445 are formed within the well 425 by injecting ions of a same type as a doping type of the gate electrode 435. Therefore, similar to the gate electrode 435, the doped regions 440, 445 have a doping type that is opposite to that of the well 425. Because the gate electrode 435 is doped by ions of n-type ions in an example shown in FIG. 4, the doped regions 440, 445 are formed by injection of n-type ions. However, if the well 425 is an n-type well, the doped regions 440, 445 are formed by using a p-type dopant. The doped region 440 constitutes a drain of the MV transistor 310; and the doped region 445 constitutes a source of the MV transistor 310. Subsequently, the doped region 440 and the doped region 445 are referred to as a drain region 440 and a source region 445, respectively.

The MV transistor 310 further includes a first contact CT1 and a second contact CT2 formed on the drain region 440 and the source region 445. For example, the first contact CT1 is connected to a bit line BL of a memory array circuit.

Referring to the example of FIG. 5, the LV transistor 320 includes a gate insulating film 520 formed on the semiconductor substrate 410. In such an example, the semiconductor substrate 410 includes a well 525. The well 525 is formed on the semiconductor substrate 410 via the DNW 430, as shown in the example of FIG. 5. As with the corresponding well 425, the well 525 is formed by injecting particular type ions into the semiconductor substrate 410. In an example, the well 525 is formed to have a doping concentration that is lower than that of the well 425. Although the example of FIG. 4 shows that the well 425 and the well 525 are separated from one another, in another example, the well 425 and the well 525 are integrally formed so that the MV transistor 310 and the LV transistor 320 are structured to share the same well. The shared well is formed to have a doping concentration comparable to that of a well region to be formed in the MV transistor 310, in case the OTP cell 100 is structured to have separate wells in the MV transistor 310 and the LV transistor 320. In such an example, the gate insulating film 520 is formed on the well 525 of the semiconductor substrate 410 and is formed of an oxide film, a nitride film, an oxynitride film, a metal oxide film, or a laminated film of a combination of those films like the gate insulating film 420. Similarly, other appropriate films are used where appropriate, in examples. In an example, the gate insulating film 520 is formed to have a thickness smaller than that of the gate insulating film 420 so that the gate insulating film 520 is able to be broken down by a low voltage of about DC 1.5 V.

In such an example, the LV transistor 320 further includes a gate electrode 535 laminated on the gate insulating film 520. As is known in the art, in examples the gate electrode 535 is formed of a material such as polysilicon or metal. In such an example, the gate electrode 535 has a doping type that is opposite to that of the well 525 of the semiconductor substrate 410. For example, if the well 525 of the semiconductor substrate 410 is a p-type well, the gate electrode 535 is doped by ions of an n-type. By contrast, if the well 525 is an n-type well, the gate electrode 535 is doped by ions of a p-type.

In this example, the LV transistor 320 further includes spaced apart doped regions 540, 545 below the gate electrode 535 and the gate insulating film 520 and at left and right sides of the gate electrode 535 in the active region 325. The doped regions 540, 545 are formed within the well 525 by injecting ions of a same type as a doping type of the gate electrode 535. Therefore, in such an example, similar to the gate electrode 535, the doped regions 540, 545 have a doping type that is opposite to that of the well 525. Because the gate electrode 535 is doped by ions of n-type ions in an example as shown in FIG. 5, the doped regions 540, 545 are formed by injection of n-type ions. However, if the well 525 is an n-type well 525, the doped regions 540, 545 are formed with a p-type dopant. In such an example, the doped region 540 constitutes a source of the LV transistor 320; and the doped region 545 constitutes a drain of the MV transistor 320. Thus, subsequently, the doped region 540 and the doped region 545 are referred to as a source region 540 and a drain region 545, respectively.

In this example, the LV transistor 320 further includes a well tab 555 formed to be adjacent to one of the source region 540 and the drain region 545 in the well 525. The well tab 555 is present to apply a bias voltage such as a bias voltage of DC 0 V to the well 525 that is a bulk region, and is formed by injecting ions of a same type as that of ions that form the well 525. Because the well 525 is a p-type well 525 in an example as shown in FIG. 5, the well tab 555 is p+ type in such an example.

In the example of FIG. 4, the LV transistor 320 further includes a third contact CT3 formed on the gate electrode 535. The third contact CT3 is connected to the second contact CT2 of the MV transistor 310 so that the source region 445 of the MV transistor 310 and the gate electrode 535 of the LV transistor 320 are electrically connected to each other.

Figure 6:
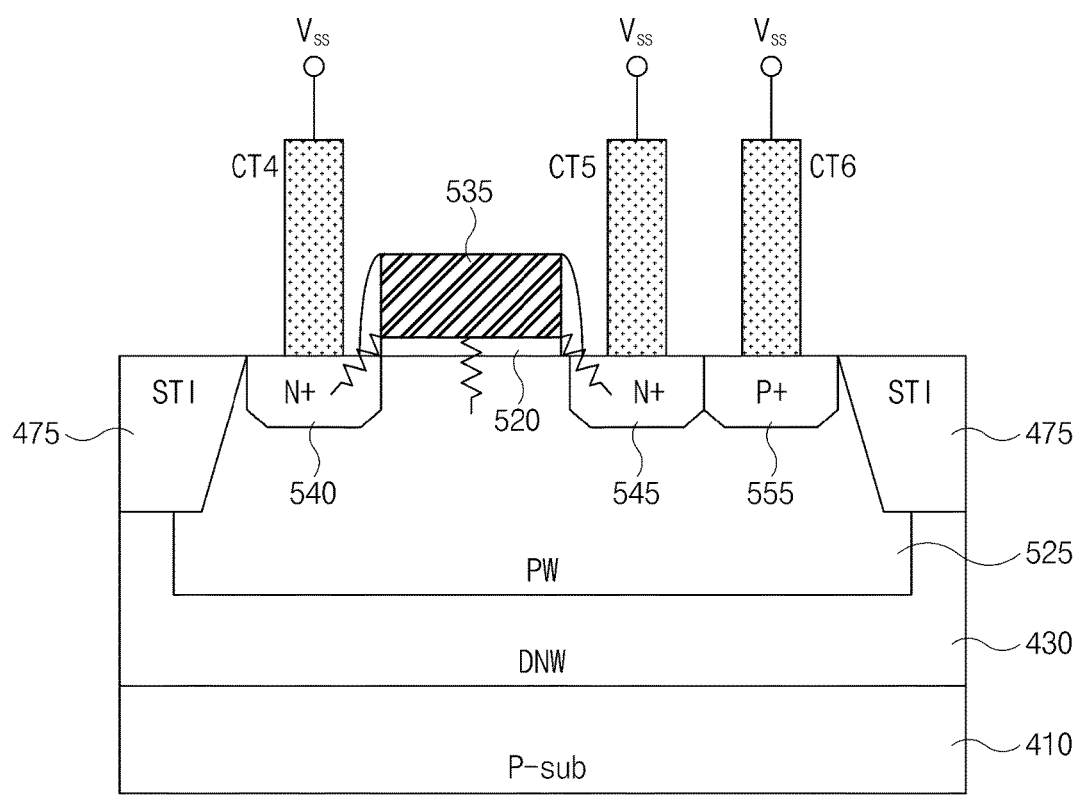
FIG. 6 is a view illustrating that breakdown occurs at a gate insulating film, a source junction, and a drain junction at a time of programming the OTP cell of FIG. 5, according to an example.

In an example, such as illustrated in FIG. 5, the LV transistor 320 further includes a fourth contact CT4 and a fifth contact CT5 formed on the source region 540 and the drain region 545, respectively. At least one of the fourth contact CT4 and the fifth contact 545 is connected to a ground voltage such as a voltage Vss and grounded. As explained further above, if the source region 540 or the drain region 545 of the LV transistor 320 is grounded, breakdown occurs at a source junction of the source region 540 or a drain junction of the drain region 545 as well as at the gate insulating film 520 in the LV transistor 320 at a time of programming of the OTP cell 100. Accordingly, a resistive path is also formed between the gate electrode 535 and the source region 540 or between the gate electrode 535 and the drain region 545, as shown in the example of FIG. 6. For this reason, programming reliability of the OTP cell 100 is able to be enhanced. In an example, both the source region 540 and the drain region 545 of the LV transistor 320 are able to be grounded. In this example, all three resistive paths are provided and thus programming reliability is able to be further enhanced.

Figure 7:
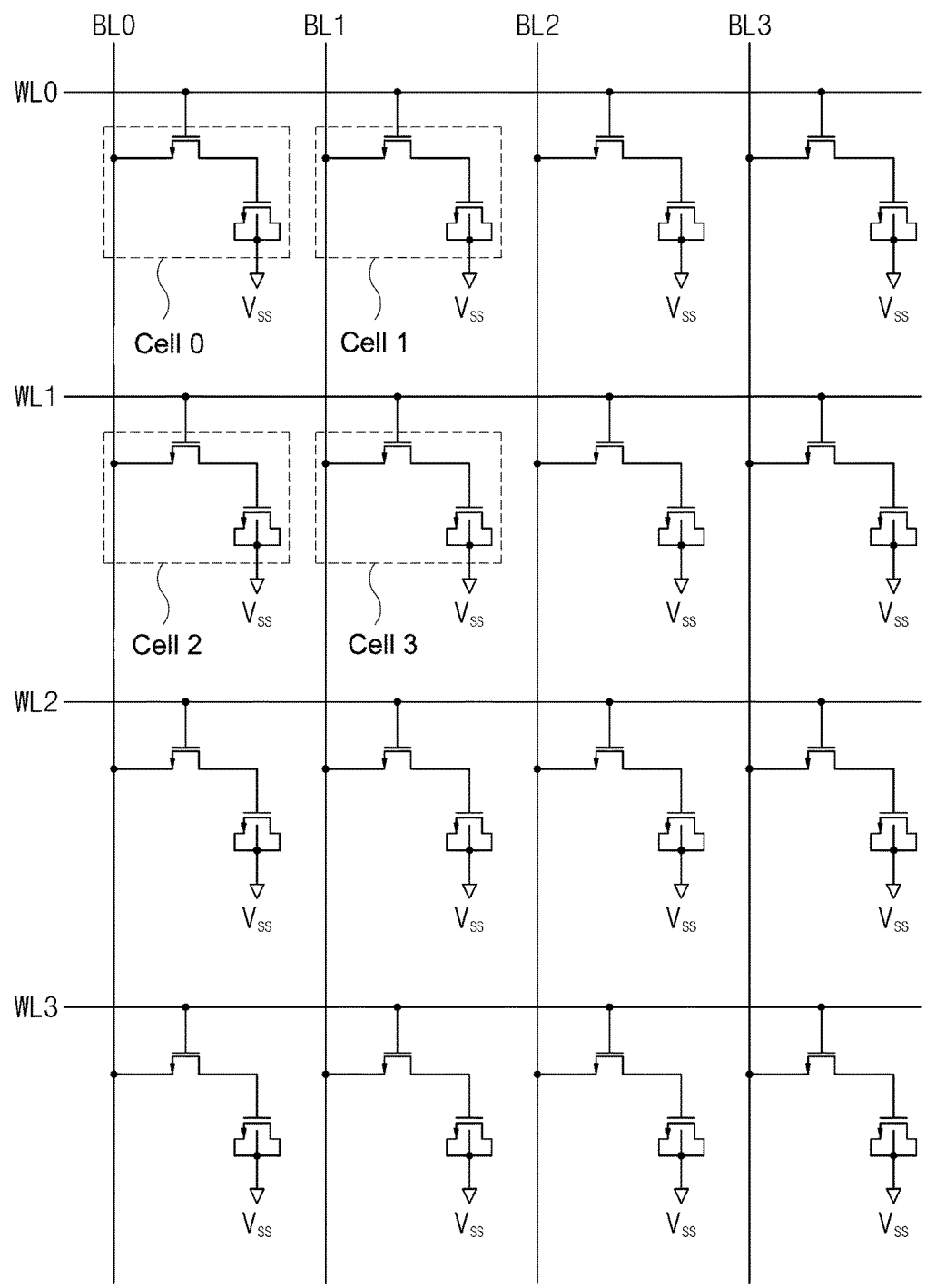
FIG. 7 is a view illustrating an OTP cell array constituted by using the OTP cell, according to an example.

FIG. 7 is a view illustrating an OTP cell array constituted by using the OTP cell, according to an example. FIG. 8 is a view illustrating a truth table for explaining program operation and read operation for each cell in the OTP cell array, according to an example. Subsequently, a method to program and read each cell in the OTP cell array is to be explained with reference to FIG. 7 and FIG. 8.

Referring to the example of FIG. 7, the OTP cell array 700 includes a plurality of OTP cells that are arranged in a matrix pattern or a cross-point array type. In the example of FIG. 7, each of the plurality of OTP cells is an OTP cell according to the present examples, which include the selection transistor 120 and the anti-fuse transistor 150 that are explained further with reference to FIG. 1 to FIG. 6. The drain terminal and the gate terminal of each selection transistor of the plurality of OTP cells are connected to the bit lines BL0-BL3 and the word lines WL0-WL3, respectively. In an example, as shown in FIG. 7, the drain terminal and the gate terminal of the selection transistor of cell 0 are connected to the bit line BL0 and the word line WL0, respectively. In another example, as shown in FIG. 7, the drain terminal and the gate terminal of the selection transistor of cell 3 are connected to the bit line BL1 and the word line WL1, respectively. For convenience of illustration, FIG. 7 shows 16 OTP cells. However, it is to be noted that a number of the OTP cells that constitute the OTP cell array 700 is not limited thereto, and another number of OTP cells are provided to constitute the OTP cell array 700 in other examples.

In order to program each of the plurality of OTP cells in the OTP cell array 700, a program voltage VPP is applied to the bit lines BL0-BL3 and the word lines WL0-WL3 connected to a corresponding OTP cell. In order to read a corresponding OTP cell, a read voltage VREAD is applied to the bit lines BL0-BL3 and the word lines WL0-WL3 connected to the corresponding OTP cell in the OTP cell array 700. Specific values of the program voltage VPP and the read voltage VREAD vary according to a design of the OTP cell in a given example. In one particular example, the program voltage VPP may be about DC 5.2 V to DC 7.2 V. In such an example, the read voltage may be about DC 1.8 V.

In order to illustrate a method to program each of the plurality of OTP cells in the OTP cell array 700 as shown in FIG. 7, an example in which cell 0 is selected and programmed is explained. In order to select and program cell 0, the program voltage VPP is applied to the bit line BL0 and the word line WL0 and a voltage of 0 V may be applied to remaining bit lines BL1-BL3 and remaining word lines WL1-WL3. In this example, the MV transistor of cell 0 is turned on and the program voltage VPP of the bit line BL0 is transferred to the LV transistor of cell 0, and thus programming to cell 0 is performed. In the example of cell 1, although the MV transistor of cell 1 is turned on, because a voltage at the bit line BL1 connected to cell 1 is 0 V, cell 1 is not programmed. In the example of cell 2, although a voltage at the bit line BL0 connected to cell 2 is VPP, because a voltage at word line WL1 connected to cell 2 is 0 V, and thus cell 2 also is not programmed. In the example of cell 3, voltages at the bit line BL1 and the word line WL 1 connected to cell 3 are both 0 V, so cell 3 also is not programmed. In the above examples, it is explained that the program voltage VPP is applied to a corresponding OTP cell in order to select and program each OTP cell. However, in order to ensure reliability of programming, a voltage higher than the program voltage VPP is applied to each OTP cell during operation. Thus, when the program voltage VPP is applied to the OTP cell that is to be programmed, a voltage that became lower by a threshold voltage Vth at the MV transistor of the corresponding OTP cell is transferred to the LV transistor of the corresponding OTP cell. Therefore, it is possible to design such that a voltage higher by the threshold voltage Vth is to be applied to the bit lines and the word lines connected to the OTP cells, and accordingly the program voltage VPP in itself is able to be transferred to the LV transistors of the OTP cells.

According to the examples disclosed herein, it becomes possible to provide the OTP cell having programming reliability and further to provide system stability in various systems that use such an OTP cell.

In the examples disclosed herein, the arrangement of the illustrated components may vary depending on an environment or requirements to be implemented. For example, some of the components may be omitted or several components may be integrated and carried out together. In addition, the arrangement order of some of the components is possibly changed.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A non-volatile semiconductor storage device, comprising:
   a gate insulating film formed on a semiconductor substrate;
   a gate electrode formed on the gate insulating film;
   first and second spaced apart doped regions formed below the gate insulating film and the gate electrode in the semiconductor substrate,
   wherein a grounded region of the first and second spaced apart doped regions is grounded via a contact; and
   a well tap region formed adjacent to the first spaced apart doped region or the second spaced apart doped region in the semiconductor substrate, wherein the well tap region is grounded via a second contact.

2. The device of claim 1, wherein a semiconductor layer of the semiconductor substrate is formed of Si, Ge, SiGe, GaP, GaAs, SiC, SiGeC, InAs, or InP.

3. The device of claim 1, wherein the gate insulating film is formed of an oxide film, a nitride film, an oxynitride film, a metal oxide film, or a laminated film of a combination of two or more of oxide, nitride, oxynitride, and metal oxide films.

4. The device of claim 1, wherein the gate insulating film has a thickness that is able to be broken down by a voltage of about DC 5 V.

5. The device of claim 1, wherein a first well region is formed in the semiconductor substrate, and the first and the second spaced apart doped regions and the well tap region are formed within the first well region.

6. The device of claim 5, wherein in response to a write voltage being applied to the gate electrode, the gate insulating film is broken down so that a resistive path is formed between the gate electrode and the well region.

7. The device of claim 6, wherein in response to the write voltage being applied to the gate electrode, the resistive path is formed between the gate electrode and the grounded region.

8. The device of claim 1, further comprising:
a second gate insulating film formed on the semiconductor substrate;
a second gate electrode formed on the second gate insulating film; and
third and fourth spaced apart doped regions formed below the second gate insulating film and the second gate electrode in the semiconductor substrate.

9. The device of claim 8, wherein a second well region is formed in the semiconductor substrate, and the third and fourth spaced apart doped regions are formed within the second well region.

10. The device of claim 8, further comprising:
a third contact formed on the gate electrode and a fourth contact formed on the fourth doped region, wherein the gate electrode and the fourth doped region are connected via the third contact and the fourth contact.

11. The device of claim 8, wherein the gate insulating film, the gate electrode, and the first and second spaced apart doped regions constitute a low voltage (LV) transistor, the second gate insulating film, the second gate electrode, and the third and fourth spaced apart doped regions constitute a middle voltage (MV) transistor, and the LV transistor and the MV transistor are separated by a shallow trench isolation (STI) structure in the semiconductor substrate.

12. The device of claim 11, wherein the LV transistor is an n-type Metal-Oxide-Semiconductor (MOS) transistor.

13. A one time programmable (OTP) cell, comprising:
a first MOS transistor formed in a middle voltage (MV) transistor area in a semiconductor substrate; and
a second MOS transistor formed in a low voltage (LV) transistor area in the semiconductor substrate, wherein the second MOS transistor comprises a gate electrode and first and second doped regions formed in the LV transistor area, and the gate electrode is connected to the first MOS transistor via a contact,
wherein either one or both of the first and second doped regions is grounded via a second contact, and
the MV transistor area and the LV transistor area are separated by a shallow trench isolation (STI) structure in the semiconductor substrate.

14. The OTP cell of claim 13, further comprising a well tap region formed adjacent to the first doped region or the second doped region in the LV transistor area, wherein the well tap region is grounded via a third contact.

15. The OTP cell of claim 14, wherein the semiconductor substrate comprises a LV well region formed in the LV transistor area, and the first and second doped regions and the well tap region are formed within the LV well region.

16. The OTP cell of claim 15, wherein the second MOS transistor further comprises a gate insulating film formed below the gate electrode in the LV transistor area, and in response to a write voltage being applied to the gate electrode via the first MOS transistor, the gate electrode is broken down so that a resistive path is formed between the gate electrode and the well region.

17. The OTP cell of claim 16, wherein in response to the write voltage being applied to the gate electrode via the first MOS transistor, a resistive path is formed between one region of the first doped region, the second doped region, and the well region, and the gate electrode.

18. A one time programmable (OTP) cell, comprising:
a first MOS transistor formed in a middle voltage (MV) transistor area in a semiconductor substrate; and
a second MOS transistor formed in a low voltage (LV) transistor area in the semiconductor substrate, wherein the second MOS transistor comprises a gate electrode and first and second doped regions formed in the LV transistor area, and the gate electrode is connected to the first MOS transistor via a contact,
wherein either one or both of the first and second doped regions is grounded via a second contact, and
wherein the MV transistor area comprises an MV well region formed in the semiconductor substrate.

* * * * *